United States Patent
Lai

(10) Patent No.: US 6,525,941 B1
(45) Date of Patent: Feb. 25, 2003

(54) HEAT DISSIPATING DEVICE WITH A PRESSING MEMBER THAT IS ROTATABLE TO URGE A FAN MODULE TOWARD A CIRCUIT BOARD

(75) Inventor: Yaw-Huey Lai, Hsi-Chih (TW)

(73) Assignee: Tai-Sol Electronics Co., Ltd. (TW)

( * ) Notice: Subject to any disclaimer, the term of this patent is extended or adjusted under 35 U.S.C. 154(b) by 0 days.

(21) Appl. No.: 10/034,710

(22) Filed: Dec. 27, 2001

(51) Int. Cl.[7] .................................................. H05K 7/20
(52) U.S. Cl. .................... 361/697; 24/458; 165/80.3; 165/121; 257/727; 248/510; 361/710; 361/719
(58) Field of Search .................... 24/457–458; 165/80.2, 165/80.3, 121–127; 174/16.3; 361/687, 690, 694–697, 704, 707, 709–710, 719–720; 257/722, 718–719, 726–727; 248/505, 510; 415/176–178, 213.1, 214.1

(56) References Cited

U.S. PATENT DOCUMENTS 5,943,209 A * 8/1999 Liu ............................. 361/697
6,049,457 A * 4/2000 Lee ............................. 361/704
6,332,251 B1 * 12/2001 Ho et al. ..................... 165/80.3
6,404,633 B1 * 6/2002 Hsu ............................ 361/704

* cited by examiner

Primary Examiner—Gregory Thompson
(74) Attorney, Agent, or Firm—Ostrolenk, Faber, Gerb & Soffen, LLP

(57) ABSTRACT

A heat dissipating device includes a heat-dissipating fin module disposed in a base frame that is mounted on a circuit board and in heat-conductive contact with an electronic component on the circuit board. A fan module includes parallel positioning members connected to a fan. Each positioning member has a positioning end portion connected to the base frame. An operating member is coupled pivotally to a coupling end portion of each positioning member, and has opposite engaging end portions, and an intermediate pressing portion that is operable so as to rotate the engaging end portions to engage the base frame such that an abutting portion of each positioning member is pulled toward and applies pressure on the fin module, thereby enabling the fin module to contact tightly the electronic component.

7 Claims, 4 Drawing Sheets

HEAT DISSIPATING DEVICE WITH A PRESSING MEMBER THAT IS ROTATABLE TO URGE A FAN MODULE TOWARD A CIRCUIT BOARD

BACKGROUND OF THE INVENTION

1. Field of the Invention

The invention relates to a heat dissipating device, more particularly to a heat dissipating device which includes a pressing member that is rotatable to urge a fin module toward a circuit board.

2. Description of the Related Art

FIG. 1 illustrates a conventional heat dissipating device for dissipating heat generated by an electronic component 63, such as a central processing unit, that is mounted on a circuit board 64. The conventional heat dissipating device includes a base frame 65 mounted on the circuit board 64, a heat-dissipating fin module 62 disposed in the base frame 65, and a fan module 6 mounted on the base frame 65 and disposed above the fin module 62. The base frame 65 has a bottom part formed with a through hole 653 that is registered with the electronic component 63 so as to allow the electronic component 63 to extend thereinto when the base frame 65 is mounted on the circuit board 64, and opposite flange members 651 extending respectively and upwardly from sides of the bottom part that are opposite in a first direction. Each of the flange members 651 is formed with a pair of engaging holes 652 that are spaced apart from each other in a second direction transverse to the first direction. The fin module 62 is disposed on the bottom part and is in heat-conductive contact with the electronic component 63. The fin module 62 has a plurality of parallel fin plates 620. The fan module 6 includes a positioning seat 66 disposed above the fin plates 620, a fan 61 mounted on the positioning seat 66, and parallel positioning members 67. The positioning seat 66 has opposite downwardly extending side walls 661 for positioning the fin plates 620 therebetween, and a pair of upwardly opening positioning grooves 662 that are spaced apart from each other in a second direction. The positioning seat 66 is formed with a through hole 663 so as to allow air currents from the fan 61 to reach the fin plates 620. Each of the positioning members 67 has a positioning piece 671, an engaging piece 672 opposite to the positioning piece 671, and a downwardly extending intermediate positioning block 673 that is disposed in a respective one of the positioning grooves 662 of the positioning seat 66. When the fan module 6 is assembled onto the base frame 65, first, the positioning piece 671 of each of the positioning members 67 engages a respective one of the engaging holes 652 in one of the flange members 651, and the engaging piece 672 of each of the positioning member 67 is then pressed downwardly to engage a respective one of the engaging holes 652 in the other one of the flange members 651.

However, when the positioning pieces 671 of the positioning members 67 do not engage the engaging holes 652 in one of the flange members 651 at the same time, a pressure difference is formed at one side of the fin module 62 so as to result in tilting of the same. As such, different pressures applied by the positioning members 67 may result in damage to the electronic component 63 and have an adverse affect on the mounting efficiency.

SUMMARY OF THE INVENTION

Therefore, the object of the present invention is to provide a heat dissipating device with a heat-dissipating fin module that can be mounted easily and evenly on a circuit board.

According to the present invention, a heat dissipating device is adapted to a circuit board for dissipating heat produced by an electronic circuit board, and comprises:

a base frame adapted to be mounted on the circuit board and including a bottom part with first and second sides opposite to each other in a first direction, each of the first and second sides having first and second flange members that extend upwardly from the respective side and, each flange is formed with a respective engaging hole spaced apart from the other engaging hole in a second direction transverse to the first direction, the bottom part being formed with a through hole that is registered with the electronic component so as to allow the electronic component to extend thereinto when the base frame is mounted on the circuit board;

a heat-dissipating fin module disposed in the base frame on the bottom part and adapted to be in heat-conductive contact with the electronic component, that fin module having a plurality of parallel fin plates, adjacent ones of the fin plates being spaced apart from each other; and a fan module mounted on the base frame and disposed above the fin module, the fan module including a fan for inducing air currents between each adjacent pair of the fin plates, parallel positioning members connected to the fan and spaced apart from each other in the second direction, each of the positioning members having a positioning end portion, a coupling end portion opposite to the positioning end portion, and an intermediate abutting portion disposed between the positioning and coupling end portions and extending in the first direction above the fin module, the positioning end portion being formed with a positioning piece that engages a respective one of the engaging holes in one flange member on the first side of the bottom part of the base frame, and an operating member extending in the second direction and coupled pivotally to the coupling end portions of the positioning members, the operating member having opposite engaging end portions and an intermediate pressing portion between the engaging end portions, the pressing portion being operable so as to rotate the engaging end portions relative to the fan from a disengaging position, where the engaging end portions disengage the engaging holes in the flange member on the second side of the bottom part of the base frame such that the abutting portions of the positioning members are relieved from applying pressure on the fin module, to an engaging position, where each engaging end portion engages a respective engaging hole in the flange member on the second side of the bottom part of the base frame such that the abutting portions of the positioning members are pulled toward and apply pressure on the fin module, thereby enabling the fin module to contact tightly the electronic component.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
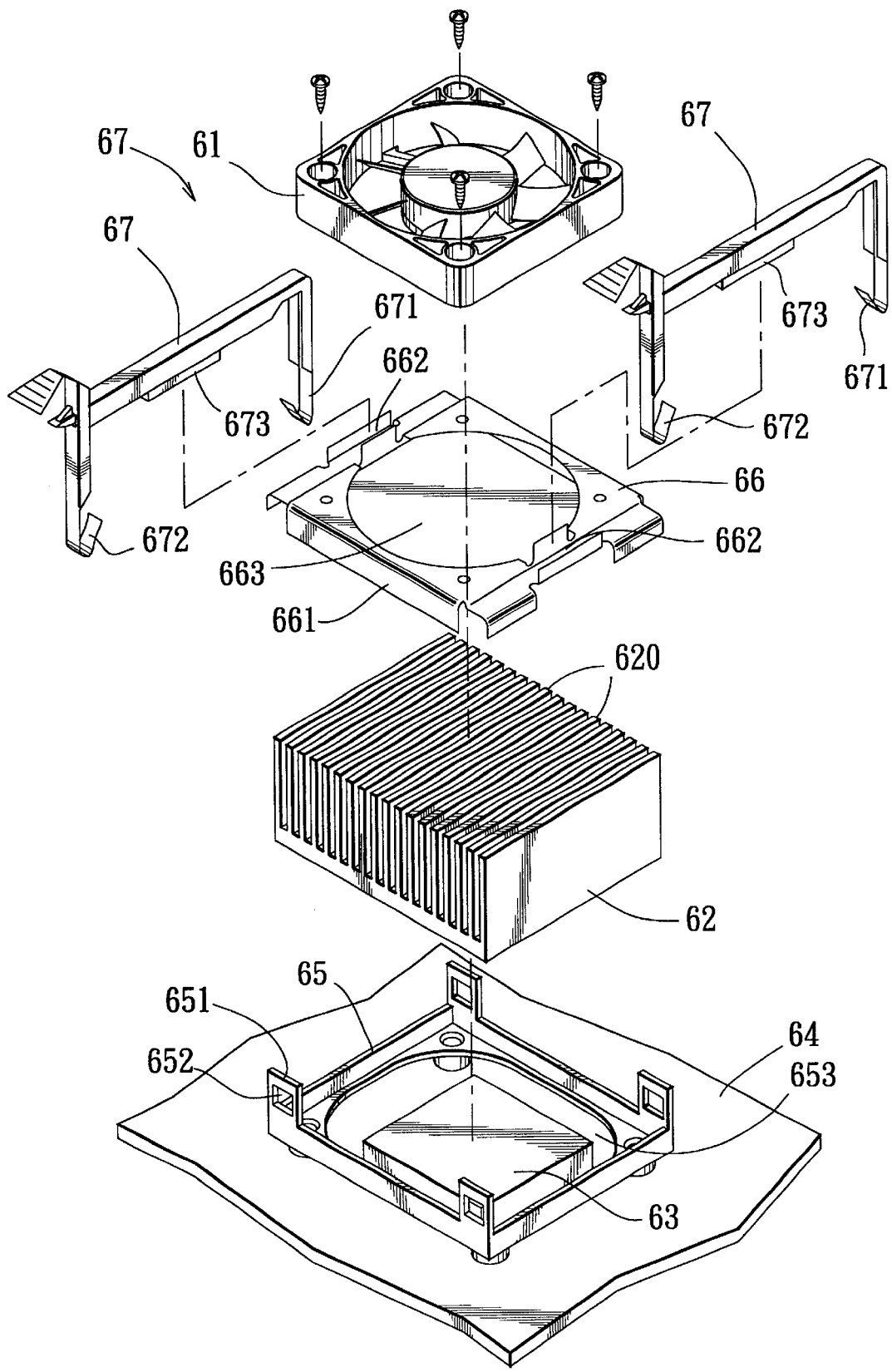
FIG. 1 is an exploded perspective view of a conventional heat dissipating device.
Figure 2:
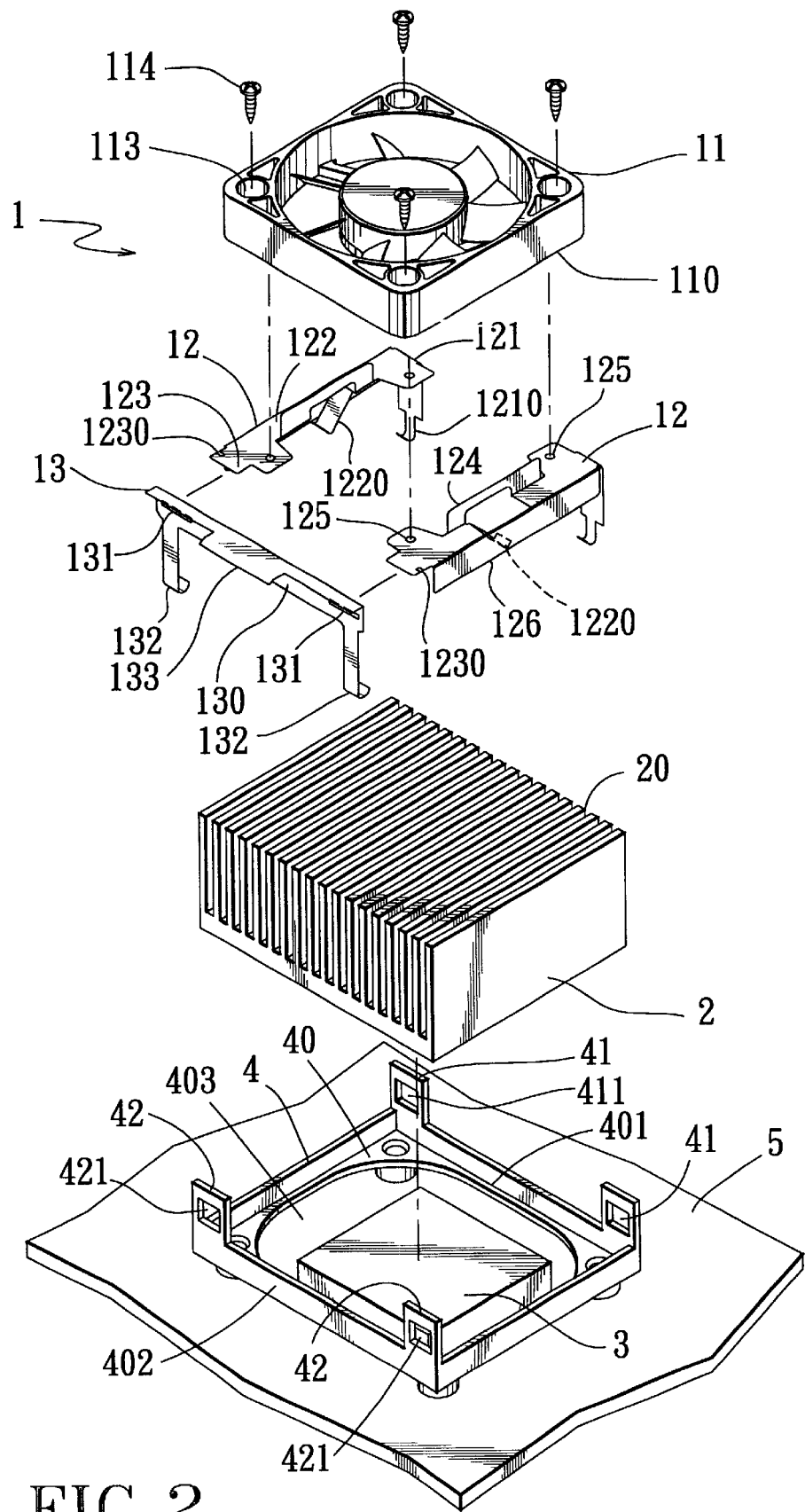
FIG. 2 is an exploded perspective view showing the preferred embodiment of a heat dissipating device according to this invention.
Figure 3:
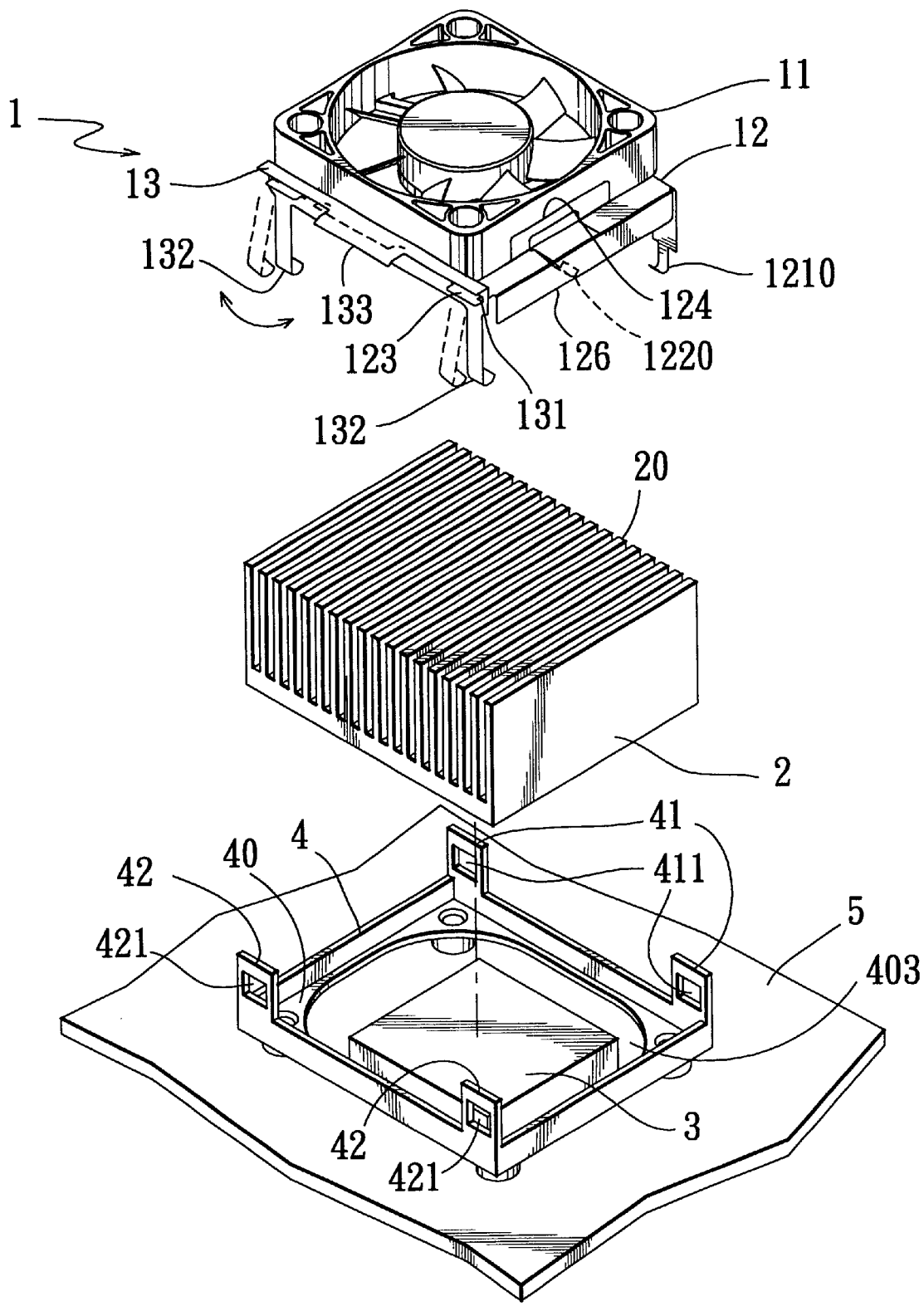
FIG. 3 is an exploded perspective view illustrating how an assembled fan module and a fin module are assembled to a base frame in the preferred embodiment.

Referring to FIGS. 2 and 3, according to the preferred embodiment of this invention, a heat dissipating device is adapted to be provided on a circuit board 5 for dissipating heat produced by an electronic component 3, such as a central processing unit, that is mounted on the circuit board 5. The heat dissipating device is shown to include a base frame 4, a heat-dissipating fin module 2, and a fan module 1.

The base frame 4 is adapted to be mounted on the circuit board 5, and includes a bottom part 40 with first and second sides 401, 402 opposite to each other in a first direction. Each of the first and second sides 401, 402 has a flange member 41, 42 that extends upwardly therefrom and that is formed with a pair of engaging holes 411, 421, which are spaced apart from each other in a second direction transverse to the first direction. The bottom part 40 is formed with a through hole 403 that is registered with the electronic component 3 so as to allow the electronic component 3 to extend thereinto when the base frame 4 is mounted on the circuit board 5.

The fin module 2 is disposed in the base frame 4 on the bottom part 40, and is adapted to be in heat-conductive contact with the electronic component 3. The fin module 2 has a plurality of parallel fin plates 20. Adjacent ones of the fin plates 20 are spaced apart from each other.

The fan module 1 is mounted on the base frame 4 and is disposed above the fin module 2. The fan module 1 includes a fan 11, parallel positioning members 12, and an operating member 13. The fan 11, which is rectangular, is used for inducing air currents between each adjacent pair of the fin plates 20, and is formed with four through holes 113 at four corners thereof. The positioning members 12 are connected to the fan 11 and are spaced apart from each other in the second direction. Each of the positioning members 12 is formed by punching so as to configure the same with a positioning end portion 121, a coupling end portion 123 opposite to the positioning end portion 121, and an intermediate abutting position 122 disposed between the positioning and coupling end portions 121, 123 and extending in the first direction above the fin module 2.

The positioning end portion 121 of each positioning member 12 is formed with a positioning piece 1210 that engages a respective one of the engaging holes 411 in the flange member 41 on a first side 401 of the bottom part of the base frame 4. In this embodiment, the positioning members 12 are retained on a bottom side 110 of the fan 11. Four screw fasteners 114 extend through the through holes 113 in the fan 11, and engage four screw holes 125 in the positioning members 12, respectively, so as to secure the fan 11 on the positioning members 12 (see FIG. 3). The abutting portion 122 of each positioning member 12 is formed integrally with a spring tab 1220 for contacting the fin module 2. The abutting portion 122 of each positioning member 12 is further formed with an upwardly extending limit flange 124 and a downwardly extending positioning flange 126 such that the fan 11 can be confined between the limit flanges 124 and that the fin module 2 can be positioned between the positioning flanges 126. The coupling end portion 123 of each positioning member 12 is formed with a neck 1230.

The operating member 13 extends in the second direction and is coupled pivotally to the coupling end portions 123 of the positioning members 12. The operating member 13 is similarly formed by punching so as to configure the same with opposite engaging end portions 132 and an intermediate pressing portion 130 between the engaging end portions 132. In this embodiment, the pressing portion 130 of the operating member 13 is formed with a pair of slots 131. The neck 1230 of the coupling end portion 123 of each of the positioning members 12 extends into a respective on of the slots 131, thereby coupling pivotally the operating member 13 to the positioning members 12 (see FIG. 3).

Figure 4:
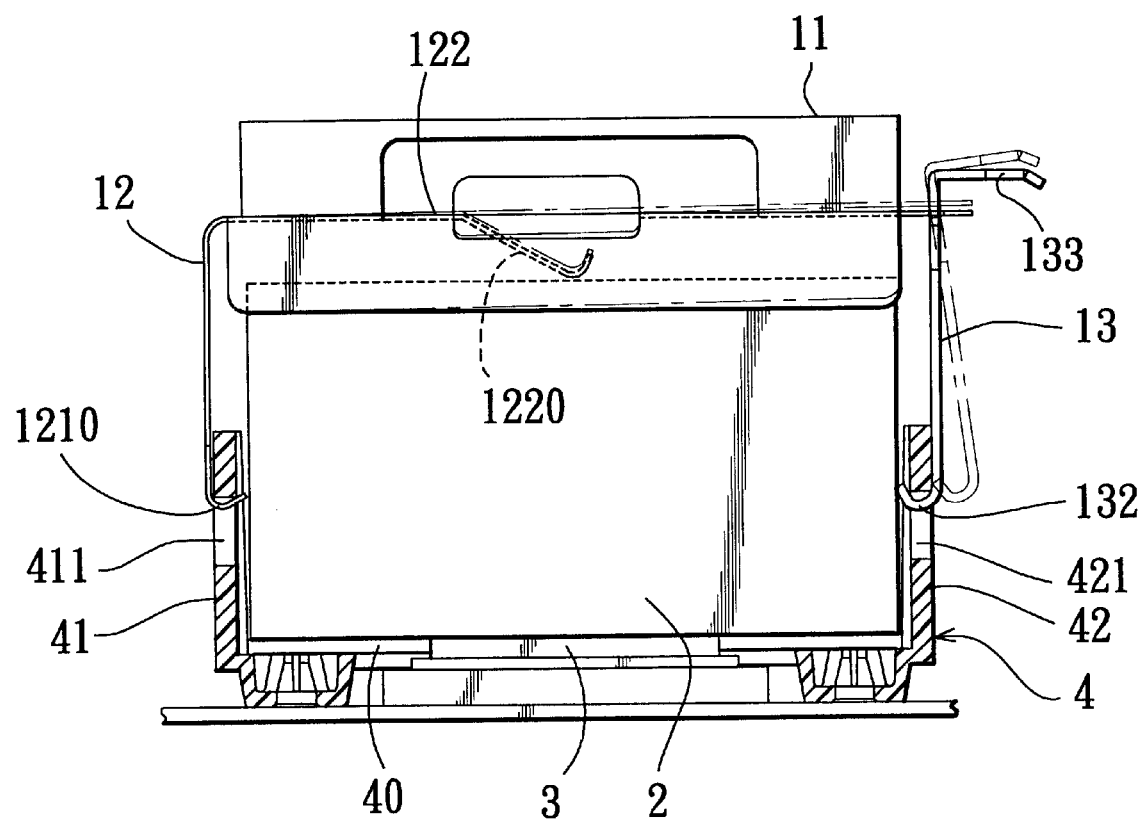
FIG. 4 is an assembled schematic partly sectional, side view showing the preferred embodiment.

The pressing portion 130 is formed with a force bearing flange 133. The pressing portion 130 is operable so as to rotate the engaging end portions 132, relative to the fan 11, from a disengaging position, where the engaging end portions 132 disengage the engaging holes 421 in the flange member 42 on the second side 402 of the bottom part 40 of the base frame 4. In this way, the abutting portions 122 of the positioning members 12 are relieved from applying pressure on the fin module 2 (as indicated by the imaginary-line portions in FIG. 4). The positioning members 12 move to an engaging position where the engaging end portions 132 engage the engaging holes 421 in the flange member 42 on the second side 402 of the bottom part 40 of the base frame 4 such that the abutting portions 122 of the positioning members 12 are pulled toward and apply pressure on the fin module 2, thereby enabling the fin module 2 to contact tightly the electronic component 3 (see FIG. 4).

It is noted that, in the heat dissipating device of the present invention, the engaging end portions 132 engage respectively and simultaneously the engaging holes 421 in the flange member 42 on the second side 402 of the bottom part 40 of the base frame 4 when the fan module 1 is assembled onto the base frame 4 so as to prevent damage to the electronic component 3 due to uneven distribution of pressure on the fin module 4. Furthermore, due to the presence of the spring tabs 1220, the fin module 4 can be pressed evenly and tightly against the electronic component 3 so as to ensure heat-conductive contact therebetween.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A heat dissipating device adapted to be provided on a circuit board for dissipating heat produced by an electronic component that is mounted on the circuit board, said heat dissipating device comprising:

a base frame adapted to be mounted on the circuit board and including a bottom part with first and second sides opposite to each other in a first direction, each of said first and second sides having first and second flange members that extend upwardly from the respective side and each flange is formed with a respective engaging hole spaced apart from the other engaging hole in a second direction transverse to the first direction, said bottom part being formed with a through hole that is registered with the electronic component so as to allow the electronic component to extend thereinto when said base frame is mounted on the circuit board;

a heat-dissipating fin module disposed in said base frame on said bottom part and adapted to be in heat-conductive contact with the electronic component, said fin module having a plurality of parallel fin plates, adjacent ones of said fin plates being spaced apart from each other; and a fan module mounted on said base frame and disposed above said fin module, said fan module including a fan for inducing air currents between each adjacent pair of said fin plates, parallel positioning members connected to said fan and spaced apart from each other in the second direction, each of said positioning members having a positioning end portion, a coupling end portion opposite to said positioning end portion, and an intermediate abutting portion disposed between said positioning and coupling end portions and extending in the first direction above said fin module, said positioning end portion being formed with a positioning piece that engages a respective one of said engaging holes in one said flange member on said first side of said bottom part of said base frame, and an operating member extending in the second direction and coupled pivotally to said coupling end portions of said positioning members, said operating member having opposite engaging end portions and an intermediate pressing portion between said engaging end portions, said pressing portion being operable so as to rotate said engaging end portions relative to said fan from a disengaging position, where said engaging end portions disengage said engaging holes in said flange member on said second side of said bottom part of said base frame such that said abutting portions of said positioning members are relieved from applying pressure on said fin module, to an engaging position, where each said engaging end portion engages a respective said engaging hole in said flange member on said second side of said bottom part of said base frame such that said abutting portions of said positioning members are pulled toward and apply pressure on said fin module, thereby enabling said fin module to contact tightly the electronic component.

2. The heat dissipating device as claimed in claim 1, wherein said pressing portion of said operating member is formed with a pair of slots, and said coupling end portion of each of said positioning members is formed with a neck that extends into a respective one of said slots, thereby coupling pivotally said operating member to said positioning members.

3. The heat dissipating device as claimed in claim 1, wherein said pressing portion of said operating member is formed with a force bearing flange.

4. The heat dissipating device as claimed in claim 1, wherein said abutting portion of each of said positioning members is formed with a spring tab for contacting said fin module.

5. The heat dissipating device as claimed in claim 1, wherein said abutting portion of each of said positioning members is formed with an upwardly extending limit flange, said fan being confined between said limit flanges.

6. The heat dissipating device as claimed in claim 1, wherein said positioning members are retained on a bottom side of said fan.

7. The heat dissipating device as claimed in claim 6, further comprising a plurality of fasteners for mounting said positioning members on said fan.

* * * * *